(12) United States Patent
Shen et al.

(10) Patent No.: US 8,618,645 B2
(45) Date of Patent: Dec. 31, 2013

(54) PACKAGE PROCESS AND PACKAGE STRUCTURE

(75) Inventors: Chi-Chih Shen, Kaohsiung (TW); Jen-Chuan Chen, Taoyuan County (TW); Tommy Pan, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 663 days.

(21) Appl. No.: 12/711,870

(22) Filed: Feb. 24, 2010

(65) Prior Publication Data

US 2011/0074004 A1 Mar. 31, 2011

(30) Foreign Application Priority Data

Sep. 30, 2009 (TW) ............................... 98133269 A (51) Int. Cl.
*H01L 23/02* (2006.01)

(52) U.S. Cl.
USPC ........... 257/686; 257/678; 257/685; 257/723; 257/737; 257/738; 257/777; 257/778; 257/E21.502; 257/E21.511; 257/E21.021; 257/E23.021; 257/E23.116; 257/E23.126; 257/E23.129; 257/E23.133; 438/106; 438/107; 438/108; 438/109; 438/127

(58) Field of Classification Search
USPC ......... 257/678, 685, 686, 723, 737, 738, 777, 257/778, 787, E21.502, E21.511, E23.021, 257/E23.116, E23.124, E23.126, E23.129, 257/E23.133; 438/106–109, 127
See application file for complete search history.

(56) References Cited

U.S. PATENT DOCUMENTS

| 6,607,938 B2 | 8/2003 | Kwon et al. ................. 438/109 |
| 6,661,088 B1 | 12/2003 | Yoda et al. |
| 7,473,577 B2 | 1/2009 | Chainer |
| 2007/0045875 A1 | 3/2007 | Farnworth et al. |
| 2009/0039527 A1 | 2/2009 | Chan et al. |
| 2009/0294938 A1* | 12/2009 | Chen ............................ 257/676 |
| 2010/0133704 A1* | 6/2010 | Marimuthu et al. .......... 257/778 |
| 2011/0024888 A1* | 2/2011 | Pagaila et al. ................. 257/686 |

FOREIGN PATENT DOCUMENTS

CN 1461050 12/2003

OTHER PUBLICATIONS

"Office Action of Taiwan Counterpart Application", issued on Jan. 30, 2013, p. 1-p. 3.

* cited by examiner

*Primary Examiner* — Meiya Li
(74) *Attorney, Agent, or Firm* — J.C. Patents (57) ABSTRACT

A package process is provided. An adhesive layer is disposed on a carrier board and then plural first semiconductor devices are disposed on the adhesive layer. A first molding compound formed on the carrier board covers the sidewalls of the first semiconductor devices and fills the gaps between the first semiconductor devices so as to form a chip array board constructed by the first semiconductor devices and the first molding compound. Next, plural second semiconductor devices are flip-chip bonded to the first semiconductor devices respectively. Then, a second molding compound formed on the chip array board at least covers the sidewalls of the second semiconductor devices and fills the gaps between the second semiconductor devices. Subsequently, the chip array board is separated from the adhesive layer. Then, the first and the second molding compound are cut along the gaps between the second semiconductor devices.

10 Claims, 8 Drawing Sheets

PACKAGE PROCESS AND PACKAGE STRUCTURE

CROSS-REFERENCE TO RELATED APPLICATION

This application claims the priority benefit of Taiwan application serial no. 98133269, filed on Sep. 30, 2009. The entirety of the above-mentioned patent application is hereby incorporated by reference herein and made a part of this specification.

BACKGROUND OF THE INVENTION

1. Field of the Invention

The present invention relates to a package process and a package structure, and more particularly, to a package process for configuring a relatively large chip onto a relatively small chip and a package structure with a relatively large chip stacked on a relatively small chip.

2. Description of Related Art

In today's information society, users all seek after electronic products with high speed, high quality and multiple functions. In terms of the product exterior appearance, electronic product designs reveal a trend of light weight, thinness and compactness. Therefore, it is develops various chip package techniques such as stacked-type chip package technique.

In the stacked-type chip package technique, several chips are perpendicularly stacked together in the same package structure so that the package density is improved and the dimension of the package is decreased. Furthermore, by using 3-dimensional chip stacking method to decrease the path length of the signal transmission between the chips, rate of the signal transmission is improved and the chips with different functions can be combined in the same package.

In the conventional stacked-type chip package technique, several chips are flip-chip bonded on a wafer, and then the wafer is cut along the gaps between the chips to form several chip stacked structures. Thereafter, the chip stacked structures are configured on a circuit substrate, and a molding compound is formed on the circuit substrate to protect the chip stacked structures.

Since, in the conventional stacked-type chip package technique, the chip stacked structures are formed by cutting the wafer, in the chip stacked structures, the chips formed from cutting the wafer are larger than the chips flip-chip bonded onto the wafer. Hence, the conventional stacked-type chip package technique is used to form the package structure with the small chip stacked onto the large chip.

Furthermore, in the conventional technique, in order to decrease the whole thickness of the stacked-type chip package, the wafer is polished to decrease the thickness of the wafer before the chips are flip-chip bonded on the wafer. However, the process capacitance of the flip-chip bonding technique still has its limit value. When the thickness of the wafer is smaller than the limit value of the process capacitance, fracture often results in the flip-chip bonding technique. Thus, the production yield rate is decreased. Moreover, the fracture of the wafer with a relatively small thickness easily happens during the wafer cutting process. Hence, the production yield rate is decreased.

SUMMARY OF THE INVENTION

The present invention provides a package process capable of producing a package structure having various dimensions of chips stacked one another and having high production yield rate.

The present invention provides a package structure in which the large chip is configured on the small chip.

The present invention provides a package process comprising providing a carrier board having an adhesive layer configured thereon. A plurality of first semiconductor devices are configured on the adhesive layer, wherein the first semiconductor devices are separated from each other and fixed on the carrier board through the adhesive layer. Then, a first molding compound is formed on the carrier board to cover the sidewalls of the first semiconductor devices and to fill gaps between the first semiconductor devices so as to form a chip array board comprising the first semiconductor devices and the first molding compound. Thereafter, a plurality of second semiconductor devices is flip-chip bonded to the first semiconductor devices respectively. A second molding compound is formed on the chip array board to at least cover the sidewalls of the second semiconductor devices and to fill gaps between the second semiconductor devices. Then, the chip array board is separated from the adhesive layer. The first molding compound and the second molding compound are cut along the filled gaps between the second semiconductor devices to form a plurality of chip package units.

In one embodiment of the present invention, each of the first semiconductor devices has a plurality of through-silicon vias and the package process further comprises, after the chip array board is formed, polishing the chip array board to thin the chip array board to expose end surfaces of the through-silicon vias of each of the first semiconductor devices.

In one embodiment of the present invention, a method of polishing the chip array board comprises: polishing the chip array board until a thickness of the chip array board is substantially smaller than or equal to 4 mil.

In one embodiment of the present invention, after the second semiconductor devices are flip-chip bonded to the first semiconductor devices respectively, an area of an orthogonal projection of each of the second semiconductor devices on the carrier board is larger than an area of an orthogonal projection of each of the first semiconductor devices on the carrier board.

In one embodiment of the present invention, after the chip array board is formed, a plurality of first underfills are individually formed on the first semiconductor devices, wherein each of the first underfills covers the corresponding first semiconductor device and a portion of the first molding compound surrounding the corresponding first semiconductor device, and each of the second semiconductor devices is flip-chip bonded to the corresponding first semiconductor devices by a plurality of conductive bumps of each of the second semiconductor devices passing through the corresponding first underfill on the corresponding first semiconductor device.

In one embodiment of the present invention, the second molding compound exposes a top surface of each of the second semiconductor devices away from the corresponding first semiconductor device.

In one embodiment of the present invention, the second molding compound covers a top surface of each of the second semiconductor devices away from the corresponding first semiconductor device.

In one embodiment of the present invention, for one of the chip package units, the chip package unit is configured on a circuit substrate so that the first semiconductor device is electrically and structurally connected to the circuit substrate.

In one embodiment of the present invention, for one of the chip package units, a second underfill is formed on the circuit substrate so that the second underfill is configured between the first semiconductor device of the chip package unit and the circuit substrate and covers a plurality of conductive bumps of the first semiconductor device.

In one embodiment of the present invention, for one of the chip package units, the package process further comprises forming a third molding compound on the circuit substrate, wherein the third molding compound at least covers a sidewall of the chip package unit.

In one embodiment of the present invention, for one of the chip package units, the second molding compound and the third molding compound expose a top surface of the second semiconductor devices away from the corresponding first semiconductor device.

In one embodiment of the present invention, for one of the chip package units, the third molding compound covers top surfaces of the second semiconductor devices away from the corresponding first semiconductor device.

In one embodiment of the present invention, for one of the chip package units, the package process further comprises forming a plurality of solder balls on the surface of the circuit substrate away from the chip package unit, wherein the solder balls are electrically connected to the circuit substrate.

The present invention further provides a package structure comprising a first semiconductor device, a first molding compound, a second semiconductor devices and a second molding compound. The first molding compound encloses the sidewall of the first semiconductor device. The second semiconductor device is configured on the first semiconductor device and a portion of the first molding compound, wherein a dimension of the second semiconductor device is larger than a dimension of the first semiconductor device. The second molding compound at least covers the sidewall of the second semiconductor device and the first molding compound, wherein the first molding compound and the second molding compound are individually formed.

In one embodiment of the present invention, the side surface of the first molding compound is aligned with the side surface of the second molding compound.

In one embodiment of the present invention, a first top surface of the first molding compound facing the second semiconductor device is aligned with a second top surface of the first semiconductor device facing the second semiconductor device.

In one embodiment of the present invention, a thickness of first molding compound is substantially equal to a thickness of the first semiconductor device.

In one embodiment of the present invention, the second semiconductor device has a plurality of conductive bumps configured between the second semiconductor device and the first semiconductor device and the package structure further comprises an underfill configured between the second semiconductor device and the first semiconductor device and between the second semiconductor device and the first molding compound to enclose the conductive bumps of the second semiconductor device.

In one embodiment of the present invention, a thickness of the first semiconductor device is substantially smaller than or equal to 4 mil.

In one embodiment of the present invention, a thickness of the first semiconductor device is substantially 2 mil.

In one embodiment of the present invention, the second molding compound further covers a top surface of the second semiconductor device and the top surface is away from the first semiconductor device.

In one embodiment of the present invention, the second molding compound exposes a top surface of the second semiconductor device and the top surface is away from the first semiconductor device.

In one embodiment of the present invention, a bottom surface of the first semiconductor device away from the second semiconductor device has a plurality of conductive bumps configured thereon.

In one embodiment of the present invention, the package structure further comprises a circuit substrate with the first semiconductor device configured thereon, wherein the conductive bumps are configured between the first semiconductor device and the circuit substrate.

In one embodiment of the present invention, the chip package structure further includes an underfill configured between the first semiconductor device and the circuit substrate to enclose the conductive bumps.

In one embodiment of the present invention, the package structure further comprises a third molding compound configured on the circuit substrate to cover at least the sidewall of the first molding compound and the sidewall of the second molding compound.

In one embodiment of the present invention, the second molding compound and the third molding compound expose a top surface of the second semiconductor device and the top surface is away from the first semiconductor device.

In one embodiment of the present invention, the third molding compound covers a top surface of the second semiconductor device and the top surface is away from the first semiconductor device.

In one embodiment of the present invention, the package structure further comprises a plurality of solder balls configured on a bottom surface of the circuit substrate away from the first semiconductor device, wherein the solder balls are electrically connected to the circuit substrate.

Accordingly, the present invention can produce the package structure in which the chips with various dimensions are stacked on one another. Furthermore, since the second molding compound can strengthen the chip array board with a relatively small thickness so that the second semiconductor devices and the first semiconductor devices are securely connected to one another. Therefore, during the cutting process for forming the chip package units, the chip array board can be prevented from being fractured so that the production yield rate can be improved.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1I are cross-sectional views illustrating a package process according to one embodiment of the present invention.

Figure 1A:
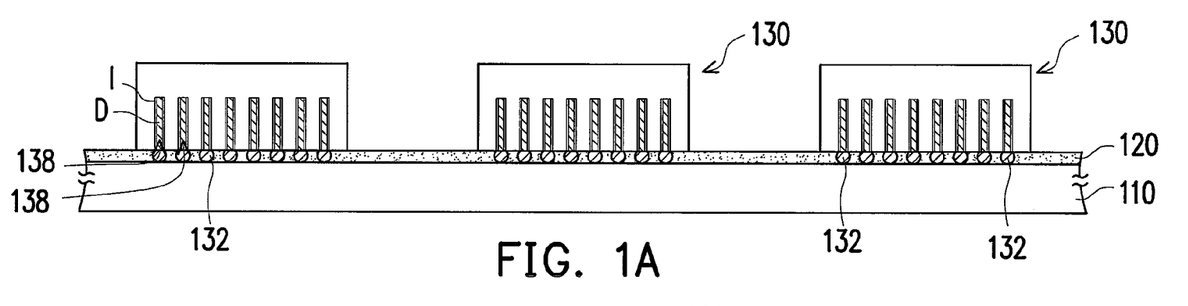
FIGS. 1A through 1I are cross-sectional views illustrating a package process according to one embodiment of the present invention.

As shown in FIG. 1A, a carrier board 110 is provided and the shape and the dimension of the carrier board 110 are similar to those of a wafer. The carrier 110 has an adhesive layer 120 configured thereon. Then, a plurality of first semiconductor devices 130 are configured on the adhesive layer 120, wherein the first semiconductor devices 130 are separated from each other and fixed on the carrier board 110 through the adhesive layer 120. In the present embodiment, each of the first semiconductor devices 130 has a plurality of conductive bumps 132 buried in the adhesive layer 120.

More clearly, in the present embodiment, before the first semiconductor devices 130 are configured on the adhesive layer 120, a plurality of openings 138 are formed in each of the first semiconductor devices 130 and each of the openings has a relatively high aspect ratio. Furthermore, an insulating layer I is formed on the inner walls of the openings 138 and then a conductive material D is formed to fill up each of the openings 138 so that the insulating layer I separate the conductive material D from the inner wall of each of the opening 138. Thereafter, the conductive bumps 132 are formed on the conductive materials D respectively.

Figure 1B:
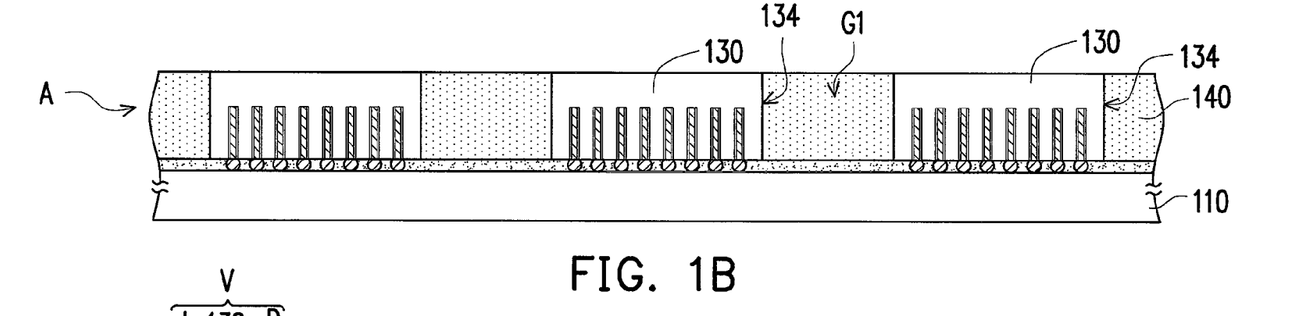

Then, as shown in FIG. 1B, a first molding compound 140 is formed on the carrier board 110 by printing or molding, wherein the first molding compound 140 covers the sidewalls 134 of the first semiconductor devices 130 and fills gaps G1 between the first semiconductor devices 130 so as to form a chip array board A comprising the first semiconductor devices 130 and the first molding compound 140. Specifically, in the present embodiment, the chip array board A can be a board type structure composed of the first molding compound 140 and the whole first semiconductor devices 130.

Figure 1C:
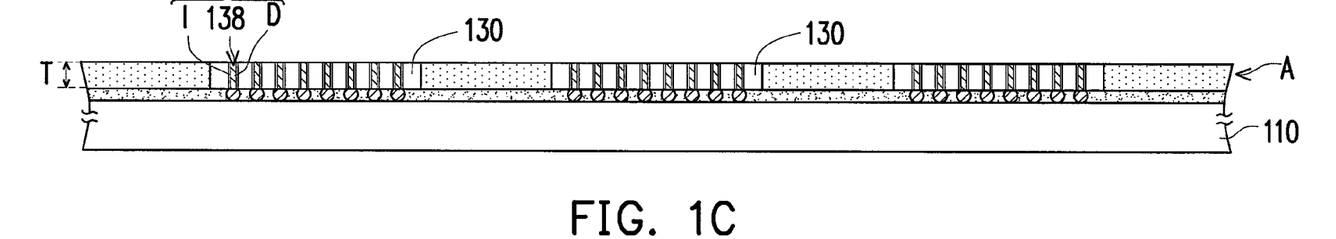

Then, as shown in FIG. 1C, in the present embodiment, the chip array board A can be polished to thin the chip array board A to expose the conductive material D. In the present embodiment, the chip array board can be polished until a thickness of the chip array board is substantially smaller than or equal to 4 mil. In the present embodiment, the conductive material D, the insulating layer I and the opening 138 together form a through-silicon via (TSV) structure V.

According to the above description, the TSV technique is applied on each of the first semiconductor devices 130 for being electrically connect to the conductive bumps 132 and to other chips (not shown) later stacked onto the first semiconductor devices. In the TSV technique, for instance, the conductive paths are fabricated within the chip or within the wafer so as to form the TSV structures V perpendicular to the surface of the chip or the wafer. Therefore, the 3-dimensional stacking density of the first semiconductor devices 130 is maximized and the dimension of stacking the first semiconductor devices 130 is minimized Hence, the signals between the first semiconductor devices 130 and the other chips stacking on the first semiconductor devices 130 can be transmitted through the TSV structures V to decrease the transmission path length between the chips and improve the signal delay phenomenon and decrease power consumption.

Figure 1D:
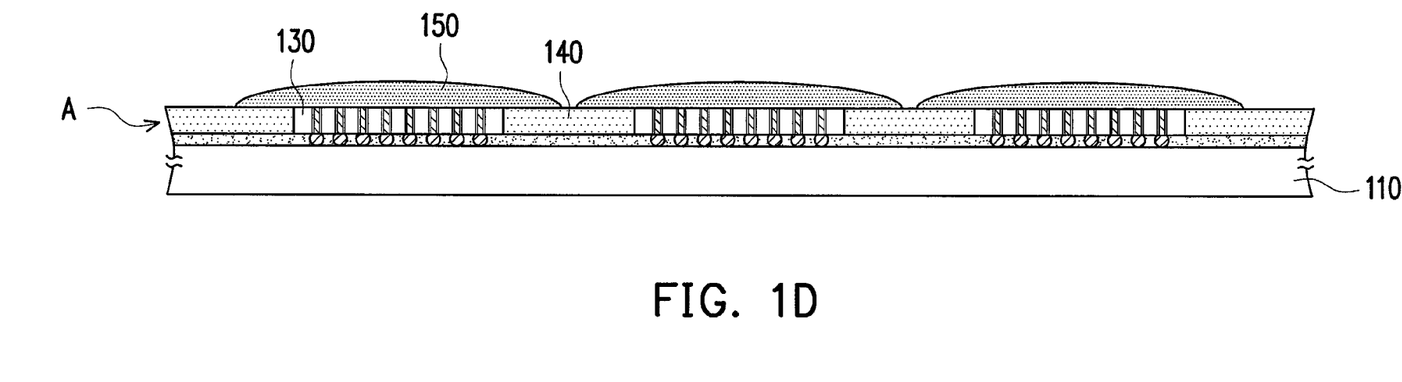

Thereafter, as shown in FIG. 1D, in the present embodiment, a plurality of underfills 150 can be separately formed the chip array board A by dispensing or screen printing. Each of the underfills 150 covers the corresponding first semiconductor device 130 and a portion of the first molding compound 140 enclosing the corresponding first semiconductor device 130. More clearly, each of the underfills 150 not only entirely covers the corresponding first semiconductor device 130 but also covers a portion of the first molding compound 140 enclosing the corresponding first semiconductor device 130. In other words, the dimension of the orthogonal projection of each of the underfills 150 on the carrier board 110 is larger than the dimension of the orthogonal projection of each of the first semiconductor devices 130 on the carrier board 110. The material of each of the underfills 150 includes non-contact paste (NCP1) or non-contact film (NCF1).

Figure 1E:
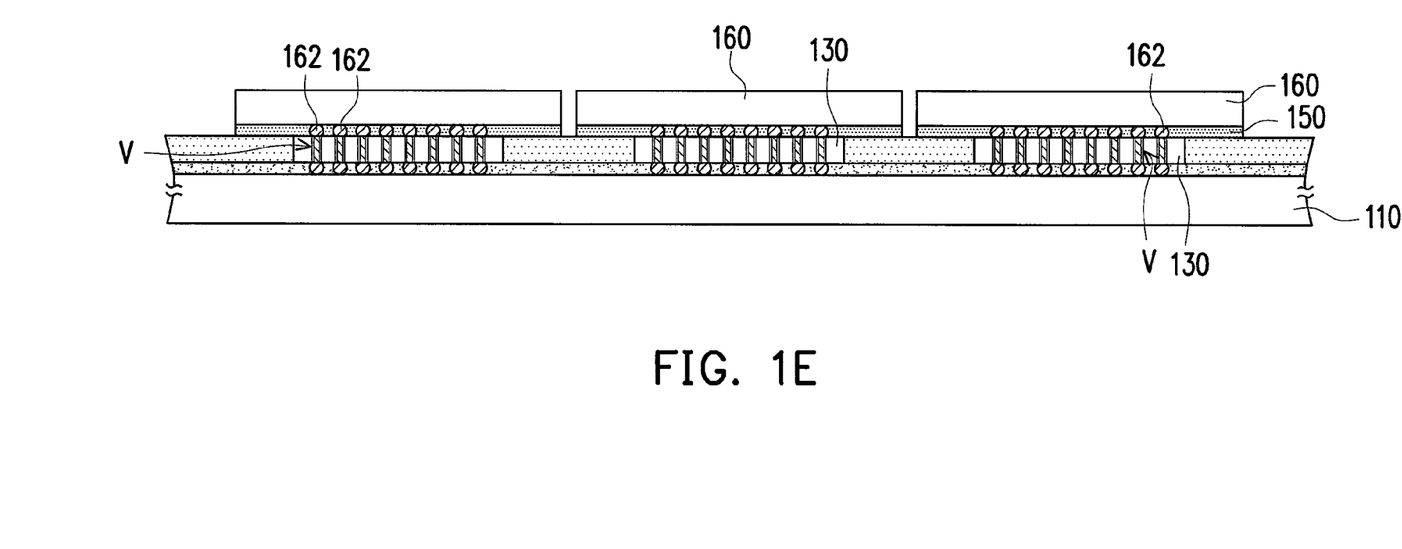

Then, as shown in FIG. 1E, a plurality of second semiconductor devices 160 are flip-chip bonded on the first semiconductor devices 130 respectively so that a plurality of the conductive bumps 162 of each of the second semiconductor devices 160 are bonded to the TSV structures V of the corresponding first semiconductor device 130 respectively by passing through the corresponding underfill 150. In the present embodiment, the dimension of the orthogonal projection of each of the second semiconductor devices 160 on the carrier board 110 is larger than the dimension of the orthogonal projection of each of the first semiconductor devices 130 on the carrier board 110. In other words, the dimension of each of the second semiconductor devices 160 is larger than the dimension of each of the first semiconductor devices 130.

Figure 1F:
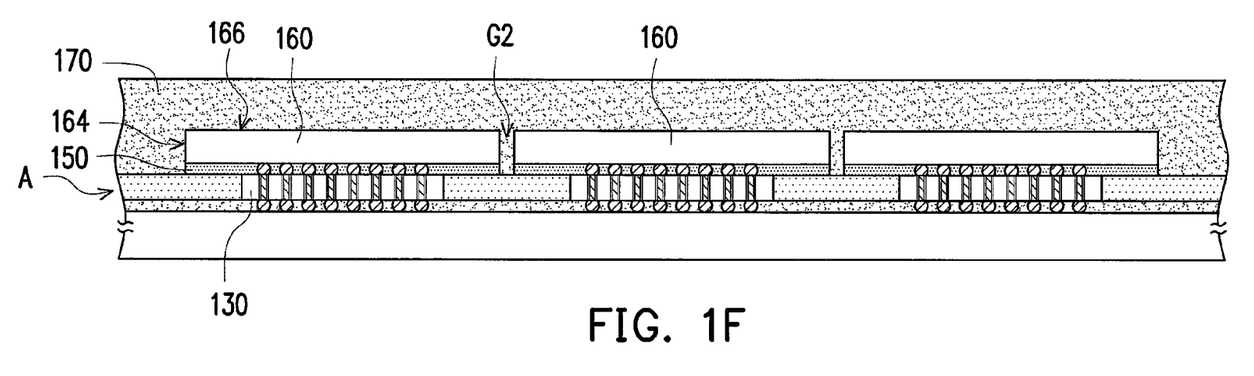

Then, as shown in FIG. 1F, a second molding compound 170 is formed on the chip array board A by printing or molding, wherein the second molding compound 170 can selectively cover the sidewalls 164 of the second semiconductor devices 160 and the top surface 166 of the second semiconductor device 160 away from the first semiconductor device 130 to fill up gaps G2 between the second semiconductor devices 160 to protect the second semiconductor devices 160. It should be noticed that since the second molding compound 170 fills up the gaps G2 between the second semiconductor devices 160, the second molding compound 170 can strengthen the chip array board A with a relatively small thickness. Therefore, the whole second semiconductor devices 160 and the whole first semiconductor devices 130 are securely connected to one another. Moreover, in the other embodiments, the step of forming the underfills 150 can be replaced by the step of filling up a space between the second semiconductor devices 160 and the chip array board A with a portion of the second molding compound 170.

Figure 1G:
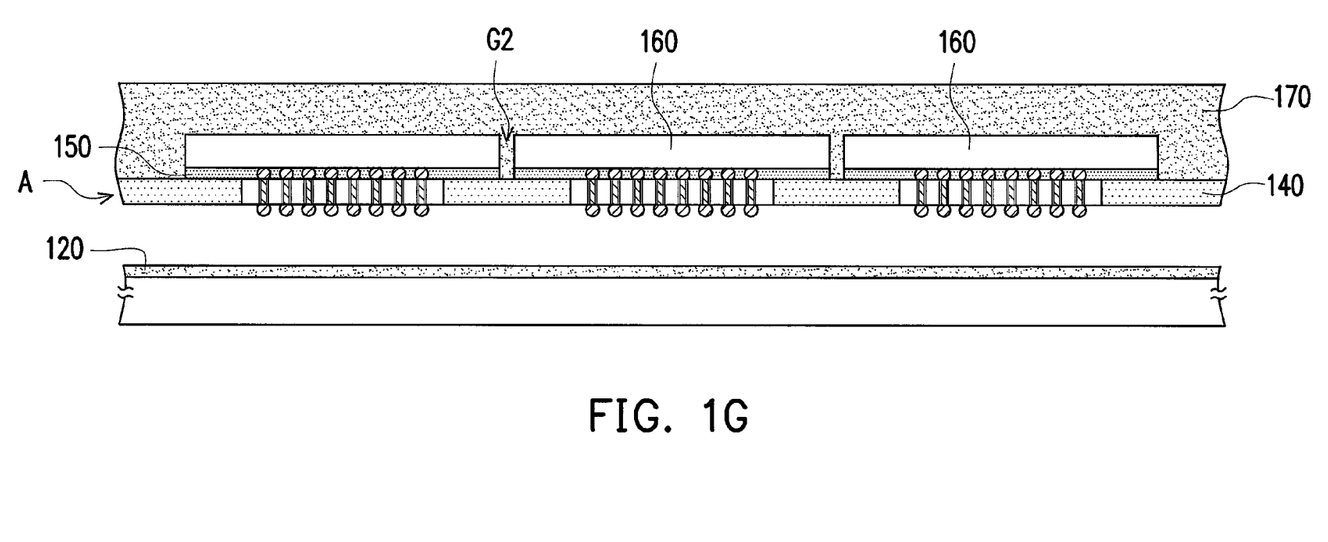

Then, as shown in FIG. 1G, the chip array board A is separated from the adhesive layer 120. Thereafter, as shown in FIG. 1G together with FIG. 1H, the second molding compound 170 and the first molding compound 140 are cut along the filled gaps G2 between the second semiconductor devices 160 to form a plurality of chip package units C1.

Figure 1H:
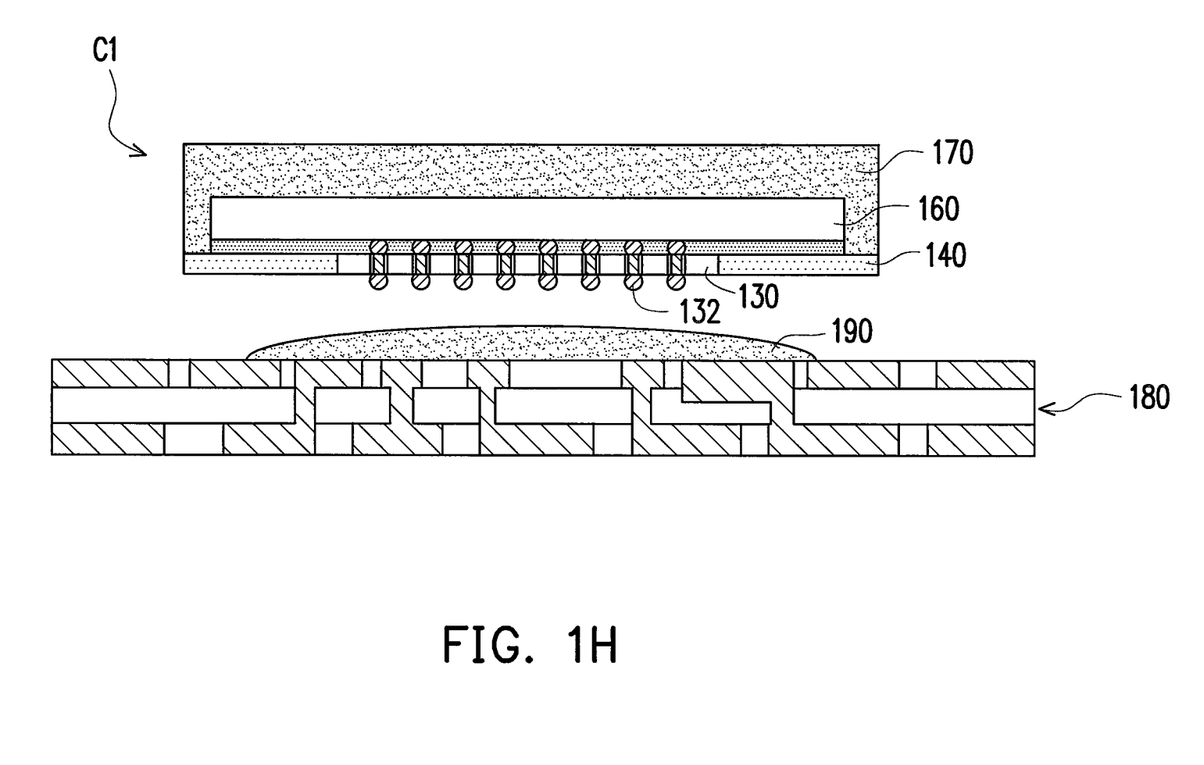

Accordingly, in the present embodiment, the first semiconductor devices 130 are connected together to form a chip array board A by using the first molding compound 140, and then the second semiconductor devices 160 are configured on the first semiconductor devices 130 of the chip array board A respectively and are connected together by the second molding compound 170. Thereafter, the first molding compound 140 and the second molding compound 170 are cut to form the chip package units C1. In other words, in the present embodiment, the first molding compound 140 and the second molding compound 170 are used to secure and connect the first semiconductor devices 130 and the second semiconductor devices 160, and then the first molding compound 140 and the second molding compound 170 are cut to form the chip package units C1.

Therefore, the present embodiment is not limited to the dimension relationship between the first semiconductor devices 130 and the second semiconductor devices 160. That is, the chip package unit C1 in the present embodiment can have the first semiconductor device 130 stacked by the second semiconductor device 160, in which the dimension of the first semiconductor device 130 can be larger than, equal to or smaller than the dimension of the second semiconductor device 160. In other words, the present invention can produce the package structure in which the chips with various dimensions are stacked on one another. Furthermore, since the second molding compound 170 can strengthen the chip array board A with a relatively small thickness so that, during the cutting process for forming the chip package units, the chip array board A can be prevented from being fractured. Thus, the production yield rate can be improved.

Figure 1I:
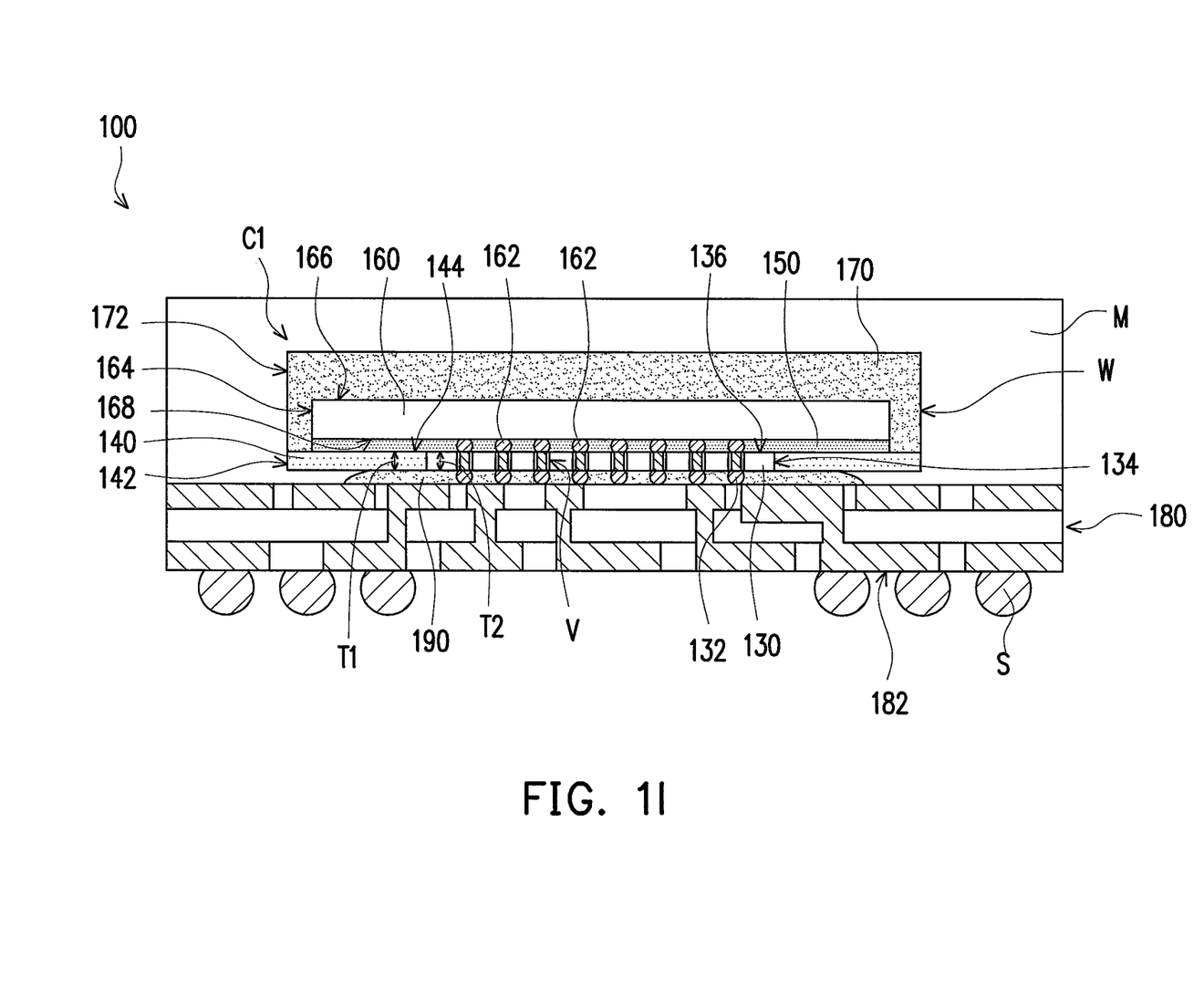

Moreover, as shown in FIG. 1H together with FIG. 1I, in the present embodiment, an underfill 190 can be formed on a circuit substrate 180 (such as printed circuit board), and one of the aforementioned chip package units C1 is configured on the circuit substrate 180 so that the first semiconductor device 130 can electrically and structurally connected to the circuit substrate 180 through the conductive bumps 132 and the underfill 190 is configured between the chip package unit C1 and the circuit board 180 to enclose the conductive bumps 132 of the first semiconductor device 130.

As shown in FIG. 1I, in the present embodiment, a third molding compound M is formed on the circuit substrate 180 by, for example, printing or molding. The third molding compound M can cover the sidewall W of the chip package unit C1 and the top surface 166 of the second semiconductor device 160. More clearly, a portion of the third molding compound M is configured on a portion of the second molding compound 170 covering the top surface 166. That is, the third molding compound M indirectly covers the top surface 166 of the second semiconductor device 160. Among other embodiments not shown in the drawings, the third molding compound M can cover the sidewall W of the chip package unit C1 and exposes the portion of the second molding compound covering the top surface 166.

Moreover, in the other embodiments, the step of forming the underfills 190 can be replaced by the step of filling up a space between the first semiconductor device 130 and the circuit substrate 180 with a portion of the third molding compound M. In addition, in order to electrically connect the chip package unit C1 to other electronic devices through the circuit substrate 180, a plurality of solder balls S can be formed on a bottom surface 182 of the circuit substrate 180 away from the chip package unit C1, and the solder balls S can be electrically connected to the circuit substrate 180. So far, the package structure 100 of the present embodiment is initially formed.

The details of package structure 100 shown in FIG. 1I are provided hereafter.

As shown in FIG. 1I, the package structure 100 of the present embodiment includes a first semiconductor device 130, a first molding compound 140, a second semiconductor device 160 and a second molding compound 170. In the present embodiment, the thickness T2 of the first semiconductor device 130 is substantially smaller or equal to 4 mil. For instance, the thickness T2 of the first semiconductor device 130 is substantially 2 mil.

The first molding compound 140 encloses the sidewall 134 of the first semiconductor device 130. In the present embodiment, a top surface 144 of the first molding compound 140 facing the second semiconductor device 160 is aligned with a second top surface 136 of the first semiconductor device 130 facing the second semiconductor device 160, and the thickness T1 of the first molding compound 140 is substantially equal to the thickness T2 of the first semiconductor device 130.

The second semiconductor device 160 is configured on the first semiconductor device 130 and a portion of the first molding compound 140, wherein a dimension of the second semiconductor device 160 is larger than a dimension of the first semiconductor device 130. In other words, the area of the bottom surface 168 of the second semiconductor device 160 facing the first semiconductor device 130 is smaller than the area of the top surface 136 of the first semiconductor device 130.

It should be noticed that, in the package structure 100 of the present embodiment, the chip with a relatively large dimension is configured on the chip with a relatively small dimension. Thus, the package structure 100 can be adaptive to the package structure having the memory chip with a relatively large dimension on the operational chip with a relatively small dimension. Moreover, because the thickness T2 of the first semiconductor device 130 of the present embodiment is relatively small (for instance, the thickness T2 is smaller than or equal to 4 mil), the total thickness of the package structure 100 can be decreased.

The second molding compound 170 covers the sidewall 164 of second semiconductor device 160, the top surface 166 of the second semiconductor device 160 away from the first semiconductor device 130 and the first molding compound 140, wherein the first molding compound 140 and the second molding compound 170 are individually formed, and the sidewall 142 of the first molding compound 140 is aligned with the sidewall 172 of the second molding compound 170.

In the present embodiment, the conductive bumps 162 are configured on the bottom surface 168 of the second semiconductor device 160 to be electrically connected to the first semiconductor device 130. In order to protect the conductive bumps 162, the underfill 150 can be configured between the second semiconductor device 160 and the first semiconductor device 130 and between the second semiconductor device 160 and the first molding compound 140 to enclose the conductive bumps 162 of the second semiconductor device 160. In addition, in the other embodiments, the underfill 150 can be replaced by filling the spaces between the second semiconductor device 160 and the first semiconductor device 130 and between the second semiconductor device 160 and the first molding compound 140 with a portion of the second molding compound 170.

In the present embodiment, the first semiconductor device 130 can be configured on the circuit substrate 180 so that the conductive bumps 132 of the first semiconductor device 130 can be electrically connected to the circuit substrate 180. In order to protect the conductive bumps 132, the underfill 190 can be configured between the first semiconductor device 130 and the circuit substrate 180 to enclose the conductive bumps 132.

Furthermore, in the present embodiment, the third molding compound M can be configured on the circuit substrate 180 to cover the sidewall 142 of the first molding compound 140, the sidewall 172 of the second molding compound 170 and the top surface 166 of the second semiconductor device 160 away from the first semiconductor device 130. More clearly, a portion of the third molding compound M is configured on a portion of the second molding compound 170 covering the top surface 166. That is, the third molding compound M indirectly covers the top surface 166 of the second semiconductor device 160. In other embodiments, the third molding compound M can cover the sidewall 142 of the first molding compound 140 and the sidewall 172 of the second molding compound 170 to expose the portion of the second molding compound 170 covering the top surface 166 of the second semiconductor device 160. Moreover, in the other embodiments, the underfills 190 can be replaced by the filling up a space between the first semiconductor device 130 and the circuit substrate 180 with a portion of the third molding compound M.

Further, the solder balls S are configured on the bottom surface 182 of the circuit substrate 180 away from the first semiconductor device 130. The solder balls S are electrically connected to the circuit substrate 180, and the circuit substrate 180 can be electrically connected to the other electronic devices (such as circuit substrate) through the solder balls S.

FIGS. 2A through 2D are cross-sectional views illustrating a package process according to one embodiment of the present invention.

Figure 2A:
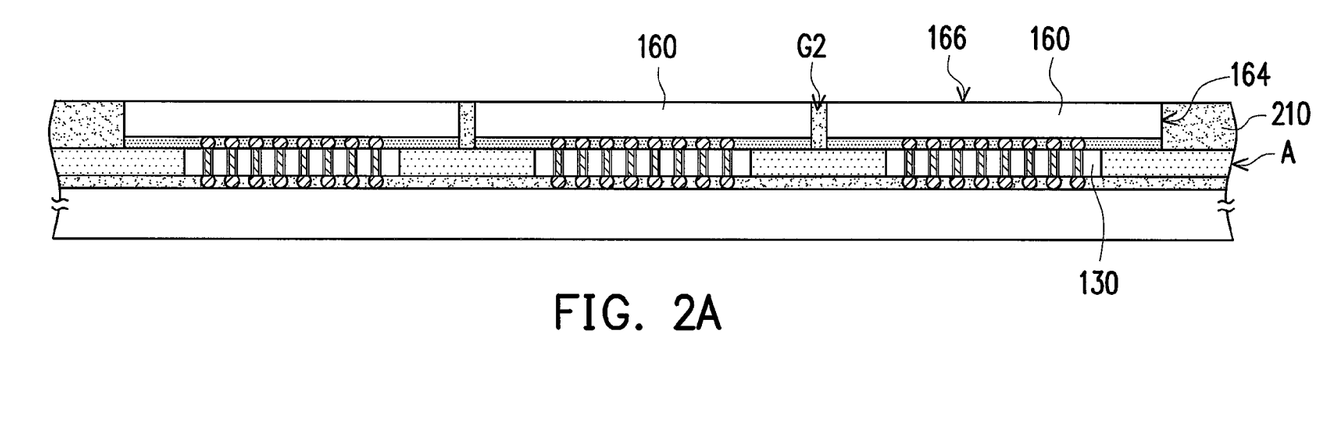
FIGS. 2A through 2D are cross-sectional views illustrating a package process according to one embodiment of the present invention.

In the present embodiment, the processes shown in FIGS. 1A through 1E can be performed first, and then, as shown in FIG. 2A, a second molding compound 210 is formed on the chip array board A. The second molding compound 210 can selectively cover the sidewalls 164 of the second semiconductor devices 160 to expose the top surface 166 of the second semiconductor device 160 away from the first semiconductor device 130 and fill up gaps G2 between the second semiconductor devices 160 to protect the second semiconductor devices 160.

Figure 2B:
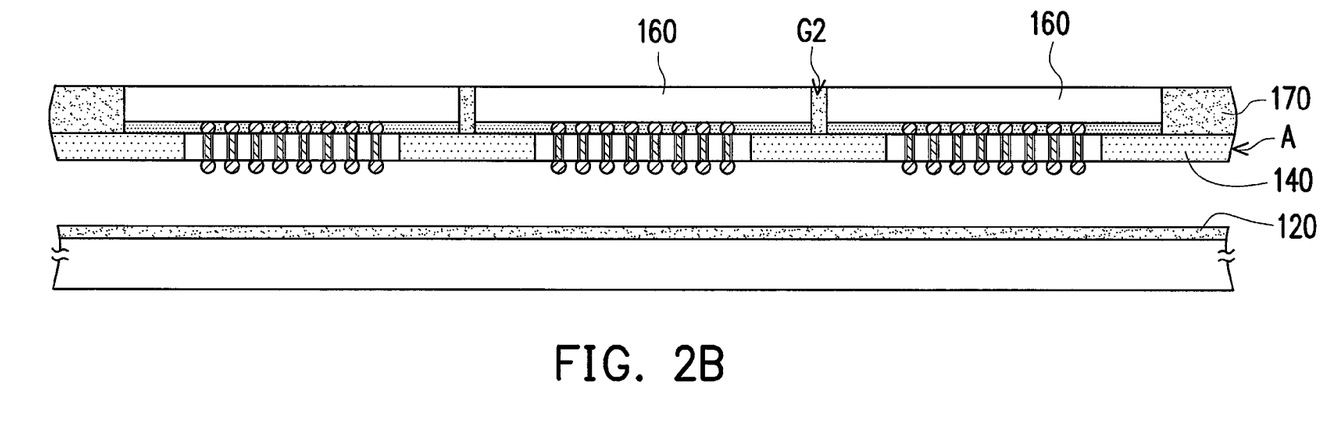

Then, as shown in FIG. 2B, the chip array board A is separated from the adhesive layer 120. Thereafter, as shown in FIG. 2B together with FIG. 2C, the second molding compound 170 and the first molding compound 140 are cut along the filled gaps G2 between the second semiconductor devices 160 to form a plurality of chip package units C2. Then, in the present embodiment, the underfill 190 can be formed on the circuit substrate 180.

Figure 2C:
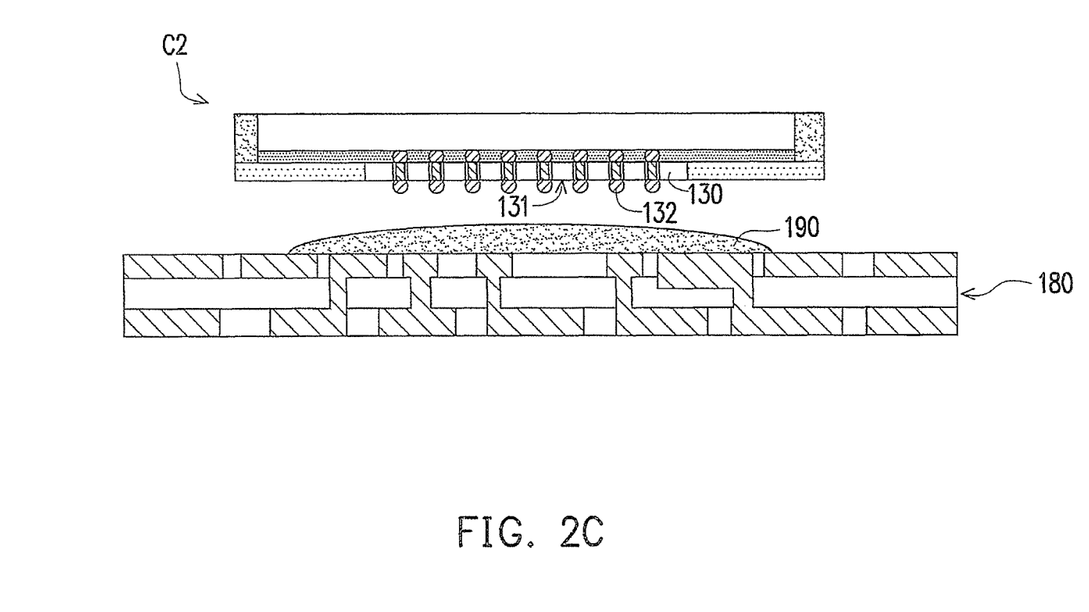
Figure 2D:
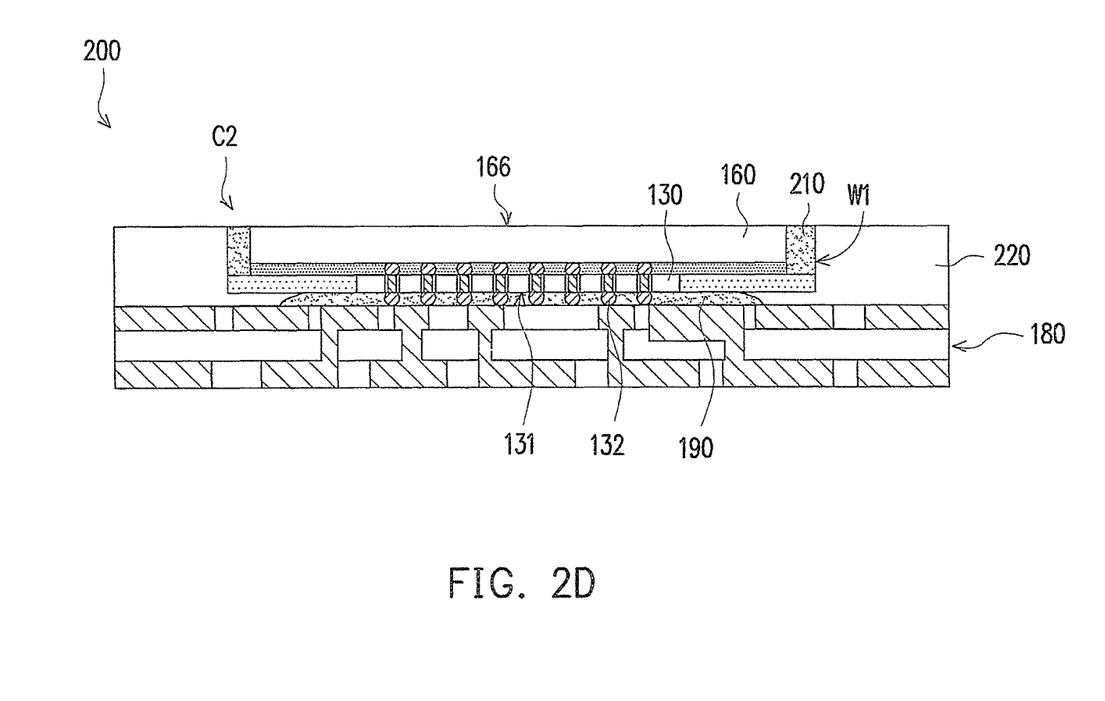

Moreover, as shown in FIG. 2C together with FIG. 2D, in the present embodiment, one of the aforementioned chip package units C2 can be configured on the circuit substrate 180 so that the first semiconductor device 130 can electrically and structurally connected to the circuit substrate 180 through the conductive bumps 132 on the bottom surface 131 of the first semiconductor device 130 and the underfill 190 is configured between the first semiconductor device 130 of the chip package unit C2 and the circuit board 180 to enclose the conductive bumps 132 of the first semiconductor device 130.

As shown in FIG. 2D, in the present embodiment, a third molding compound 220 is formed on the circuit substrate 180. The third molding compound 220 can cover the sidewall W1 of the chip package unit C2 and expose the top surface 166 of the second semiconductor device 160. So far, the package structure 200 of the present embodiment is initially formed. Among other embodiments not shown in the drawings, the third molding compound 220 can cover the sidewall W1 of the chip package unit C2 and the top surface 166.

The details of package structure 200 shown in FIG. 2D are provided hereafter.

As shown in 2D, the package structure 200 of the present embodiment and the package structure 100 shown in FIG. 1I are similar to each other, and the difference between thereto is that the second molding compound 210 and the third molding compound 220 of the package structure 200 together expose the top surface 166 of the second semiconductor device 160. Therefore, the package structure 200 can transmit the heat generated by the first semiconductor device 130 and the second semiconductor device 160 under operation to the external environment through the top surface 166 of the second semiconductor device 160. Thus, the dissipation efficiency of the package structure 200 can be improved.

Altogether, in the present invention, the first molding compound and the second molding compound are used to secure and connect the first semiconductor devices and the second semiconductor devices, and then the first molding compound and the second molding compound are cut to form the chip package units. Accordingly, the present invention can produce the package structure in which the chips with various dimensions are stacked on one another. Furthermore, since the second molding compound can strengthen the chip array board with a relatively small thickness so that the second semiconductor devices and the first semiconductor devices are securely connected to one another. Therefore, during the cutting process for forming the chip package units, the chip array board can be prevented from being fractured so that the production yield rate can be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package structure, comprising:
   a circuit substrate;
   a first semiconductor device formed on the circuit substrate, wherein the first semiconductor device is a functional device and has a plurality of through-silicon via structures;
   a first molding compound enclosing a first sidewall of the first semiconductor device;
   a second semiconductor device formed on the first semiconductor device and a first portion of the first molding compound, wherein a dimension of the second semiconductor device is larger than a dimension of the first semiconductor device;
   a second molding compound at least covering a second sidewall of the second semiconductor device and the rest portion of the top surface of the first molding compound, wherein the first molding compound and the second molding compound are individually formed;
   a plurality of conductive bumps directly attached a bottom surface of the first semiconductor device and a top surface of the circuit substrate; and
   an encapsulant formed on the circuit substrate to cover at least a third sidewall of the first molding compound and a fourth sidewall of the second molding compound.

2. The package structure of claim 1, wherein a first side surface of the first molding compound is aligned with a second side surface of the second molding compound.

3. The package process of claim 1, wherein a first top surface of the first molding compound facing the second semiconductor device is aligned with a second top surface of the first semiconductor device facing the second semiconductor device.

4. The package structure of claim 1, wherein the second semiconductor device has a plurality of conductive bumps configured between the second semiconductor device and the first semiconductor device and the package structure further comprises:
   an underfill configured between the second semiconductor device and the first semiconductor device and between the second semiconductor device and the first molding compound to enclose the conductive bumps of the second semiconductor device.

5. The package structure of claim 1, wherein a thickness of the first semiconductor device is substantially smaller than or equal to 4 mil.

6. The package structure of claim 1, wherein the second molding compound further covers a top surface of the second semiconductor device and the top surface is away from the first semiconductor device.

7. The package structure of claim 1, wherein the second molding compound exposes a top surface of the second semiconductor device and the top surface is away from the first semiconductor device.

8. The chip package structure of claim 1, further comprising:
   an underfill configured between the first semiconductor device and the circuit substrate to enclose the conductive bumps.

9. The package structure of claim 1, wherein the second molding compound and the third molding compound expose a top surface of the second semiconductor device and the top surface is away from the first semiconductor device.

10. The package structure of claim 1, wherein the third molding compound covers a top surface of the second semiconductor device and the top surface is away from the first semiconductor device.

\* \* \* \* \*